United States Patent
Chiang et al.

(10) Patent No.: US 10,511,318 B2
(45) Date of Patent: Dec. 17, 2019

(54) DIGITAL BACKGROUND CALIBRATION CIRCUIT

(71) Applicant: Nuvoton Technology Corporation, Hsinchu (TW)

(72) Inventors: Che-Hao Chiang, Yuanlin (TW); Szu-Wei Chang, Taoyuan (TW); Wei-Chan Hsu, Cupertino, CA (US); Tu-Hsiu Wang, New Taipei (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 0 days.

(21) Appl. No.: 16/176,526

(22) Filed: Oct. 31, 2018

(65) Prior Publication Data
US 2019/0253063 A1    Aug. 15, 2019

(30) Foreign Application Priority Data
Feb. 13, 2018   (TW) .............................. 107105243 A

(51) Int. Cl.
*H03M 1/10* (2006.01)
*G06F 7/58* (2006.01)

(52) U.S. Cl.
CPC ............ *H03M 1/1009* (2013.01); *G06F 7/58* (2013.01)

(58) Field of Classification Search
CPC ...... H03M 1/804; H03M 1/1009; H03M 1/38; H03M 1/0692; H03M 1/462; H03M 1/466; H03M 1/468; H03M 1/08; H03M 1/46; H03M 1/1245; H03M 1/667; H03M 1/68; H03M 1/403

USPC .................................. 341/118–121, 155, 172
See application file for complete search history.

(56) References Cited

U.S. PATENT DOCUMENTS

| | | | | |
|---|---|---|---|---|
| 6,424,276 B1 * | 7/2002 | Munoz | ................ | H03M 1/1061 341/115 |
| 6,486,806 B1 * | 11/2002 | Munoz | ................ | H03M 1/1038 341/118 |
| 7,408,490 B2 * | 8/2008 | Melanson | ........... | H03M 1/1033 341/120 |

(Continued)

FOREIGN PATENT DOCUMENTS

| CN | 103580691 B | 2/2017 |
|---|---|---|
| TW | I253235 B | 4/2006 |

(Continued)

OTHER PUBLICATIONS

Taiwan Office Action with Taiwan Search Report issued in corresponding application No. 107105243 dated Dec. 18, 2018, 6 pages.

*Primary Examiner* — Linh V Nguyen
(74) *Attorney, Agent, or Firm* — Muncy, Geissler, Olds & Lowe, P.C.

(57) ABSTRACT

A digital background calibration circuit including a digital random number generator, an analog-to-digital converter (ADC) and a plurality of switches is provided. The digital random number generator is configured to generate a first digital sequence having a plurality of bits. The ADC includes a plurality of sampling capacitors. The switches receive the first digital sequence and are coupled to the sampling capacitors. During a calibration period, the digital random number generator controls the sampling capacitors via the switches to sample the first digital sequence.

16 Claims, 10 Drawing Sheets

(56) References Cited

U.S. PATENT DOCUMENTS

| | | |
|---|---|---|
| 8,446,304 B2 | 5/2013 | Scanlan |
| 8,896,478 B2 | 11/2014 | Tsai et al. |
| 8,922,406 B2 | 12/2014 | Jansson |
| 8,981,973 B2 | 3/2015 | Kumar |
| 2012/0001781 A1* | 1/2012 | Scanlan .............. H03M 1/1004 341/110 |
| 2012/0139767 A1 | 6/2012 | Larsen et al. |
| 2015/0002321 A1* | 1/2015 | Zhou .................. H03M 1/0617 341/118 |
| 2016/0182075 A1* | 6/2016 | Devarajan ........... H03M 1/1019 341/120 |
| 2017/0012633 A1* | 1/2017 | Venca .................. H03M 1/667 |
| 2017/0149440 A1 | 5/2017 | Lin et al. |

FOREIGN PATENT DOCUMENTS

| | | |
|---|---|---|
| TW | I410052 B | 9/2013 |
| TW | I462489 B | 11/2014 |

* cited by examiner

DIGITAL BACKGROUND CALIBRATION CIRCUIT

CROSS REFERENCE TO RELATED APPLICATIONS

This Application claims priority of Taiwan Patent Application No. 107105243, filed on Feb. 13, 2018, the entirety of which is incorporated by reference herein.

BACKGROUND OF THE INVENTION

Field of the Invention

The invention relates to a digital background calibration circuit, and more particularly to a digital background calibration circuit which comprises a digital random number generator.

Description of the Related Art

Analog-to-digital converters (ADCs) are commonly used in electronic devices. An ADC transforms an analog signal into a digital signal. Generally, each ADC comprises a plurality of capacitors. When the capacitance of the capacitors disposed in an ADC shift during the manufacturing process, the ADC may generate abnormal digital signals.

BRIEF SUMMARY OF THE INVENTION

In accordance with an embodiment, a digital background calibration circuit comprises a digital random number generator, an analog-to-digital converter (ADC) and a plurality of switches. The digital random number generator is configured to generate a first digital sequence having a plurality of bits. The ADC comprises a plurality of sampling capacitors. The switches receive the first digital sequence and are coupled to the sampling capacitors. During a calibration period, the digital random number generator controls the sampling capacitors via the switches to sample the first digital sequence.

A control method applied to a digital background calibration system is provided. The digital background calibration system comprises an ADC. The ADC comprises a plurality of sampling capacitors. Each sampling capacitor is coupled to a sampling node. An exemplary embodiment of the control method is described in the following. A digital random number generator is utilized to generate a first digital sequence. The first digital sequence has a plurality of bits. During a calibration period, the voltages of the sampling nodes are controlled according to the first digital sequence to sample the first digital sequence. The digital random number generator and the ADC are integrated within a chip.

The control method may be practiced by the systems which have hardware or firmware capable of performing particular functions and may take the form of program code embodied in a tangible media. When the program code is loaded into and executed by an electronic device, a processor, a computer or a machine, the electronic device, the processor, the computer or the machine becomes an apparatus for practicing the disclosed method.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
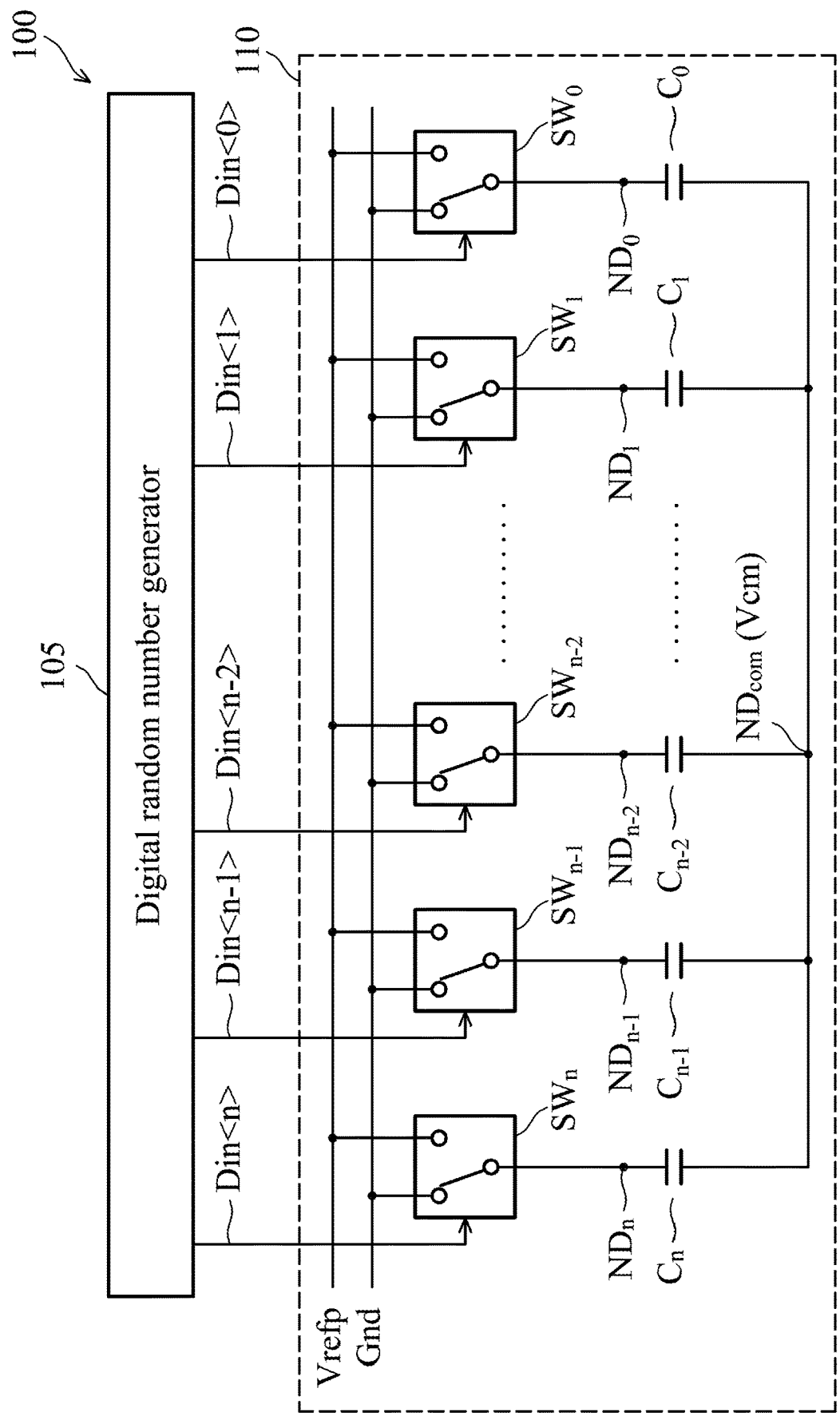
FIG. 1 is a schematic diagram of an exemplary embodiment of a digital background calibration circuit, according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of a digital background calibration circuit, according to various aspects of the present disclosure. As shown in FIG. 1, the digital background calibration circuit 100 comprises a digital random number generator 105 and an analog-to-digital converter (ADC) 110. The digital random number generator is configured to generate a digital sequence Din<n:0>. The digital sequence Din<n:0> comprises a plurality of bits Din<n>~Din<0>. The number of the bits of the digital sequence Din<n:0> is not limited in the disclosure. In one embodiment, the digital sequence Din<n:0> is a binary sequence.

In the present disclosure, the circuit of the digital random number generator 105 is not limited. In one embodiment, the digital random number generator 105 is a pseudo random number generator configured to a pseudo random sequence. In another embodiment, the digital random number generator 105 is a true random number generator which is configured to generate a true random sequence. In other embodiments, the digital random number generator 105 is a linear feedback shift register (LFSR). In some embodiments, the digital random number generator 105 generates the digital sequence Din<n:0> according to a trigger signal (not shown).

The ADC 110 at least comprises sampling capacitors $C_0$~$C_n$ and switches $SW_0$~$SW_n$. In one embodiment, the sampling capacitors $C_0$~$C_n$ and the switches $SW_0$~$SW_n$ constitute a sample and hold (S/H) circuit to sample the digital sequence Din<n:0>. The circuit of the ADC 110 is not limited in the disclosure. In one embodiment, the ADC 110 is a successive approximation register analog-to-digital converter (SAR ADC). For brevity, FIG. 1 only shows a portion circuit of the ADC 110.

Each of the sampling capacitors $C_0$~$C_n$ is coupled to a sampling node and a common node $ND_{com}$. For example, the sampling capacitor $C_0$ is coupled to the sampling node $ND_0$ and the common node $ND_{com}$. The sampling capacitor $C_1$ is coupled to the sampling node $ND_1$ and the common node $ND_{com}$. The sampling capacitor $C_n$ is coupled to the sampling node $ND_1$ and the common node $ND_{com}$. The capacitances of the sampling capacitors $C_0 \sim C_n$ are not limited in the present disclosure. In one embodiment, the capacitances of the sampling capacitors $C_0 \sim C_n$ are different from each other. In some embodiments, one of the capacitances of the sampling capacitors $C_0 \sim C_n$ is multiple of another of the capacitances of the sampling capacitors $C_0 \sim C_n$. For example, the capacitance of the sampling capacitor $C_0$ is half of the capacitance of the sampling capacitor $C_1$, and the capacitance of the sampling capacitor $C_{n-1}$ is half of the capacitance of the sampling capacitor $C_n$. In another embodiment, the capacitance of the sampling capacitor $C_0$ is a minimum value among the capacitances of the sampling capacitors $C_0 \sim C_n$, and the capacitance of the sampling capacitor $C_n$ is a maximum value among the capacitances of the sampling capacitors $C_0 \sim C_n$.

Each of the switches $SW_0 \sim SW_n$ is coupled to a corresponding sampling node and selectively provides a reference voltage Vrefp or a ground voltage Gnd to the corresponding sampling node according to a switching signal. In this embodiment, the bits Din<n>~Din<0> of the digital sequence Din<n:0> serve as switching signals to control the switches $SW_0 \sim SW_n$. Taking the switch $SW_0$ as an example, when the value of the bit Din<0> is "1", the switch $SW_0$ provides the reference voltage Vrefp to the sampling node $ND_0$. When the value of the bit Din<O> is "0", the switch $SW_0$ provides the ground voltage Gnd to the sampling node $ND_0$. In this case, the sampling capacitor $C_0$ performs a sampling operation according to the voltage of the sampling node $ND_0$ to determine the value of the bit Din<0>. In this case, the common node $ND_{com}$ receives a common voltage Vcm. In one embodiment, the common node $ND_{com}$ is a half of the reference voltage Vrefp.

During a calibration period, the digital random number generator 105 generates the digital sequence Din<n:0>. The switches $SW_0 \sim SW_n$ controls the sampling capacitors $C_0 \sim C_n$ according to the values of the digital sequence Din<n:0> to sample the digital sequence Din<n:0>. In this embodiment, a digital sampling operation is performed to generate an analog signal. A calibration operation is performed according to the analog signal. Therefore, no analog signal from external circuit is provided to the ADC 110 such that the cost of calibration is reduced. Furthermore, when the digital background calibration circuit leaves the factory, the user is capable of triggering a self-calibration function according to different operational environments. Therefore, the accuracy and the reliability of the ADC are increased.

Figure 2:
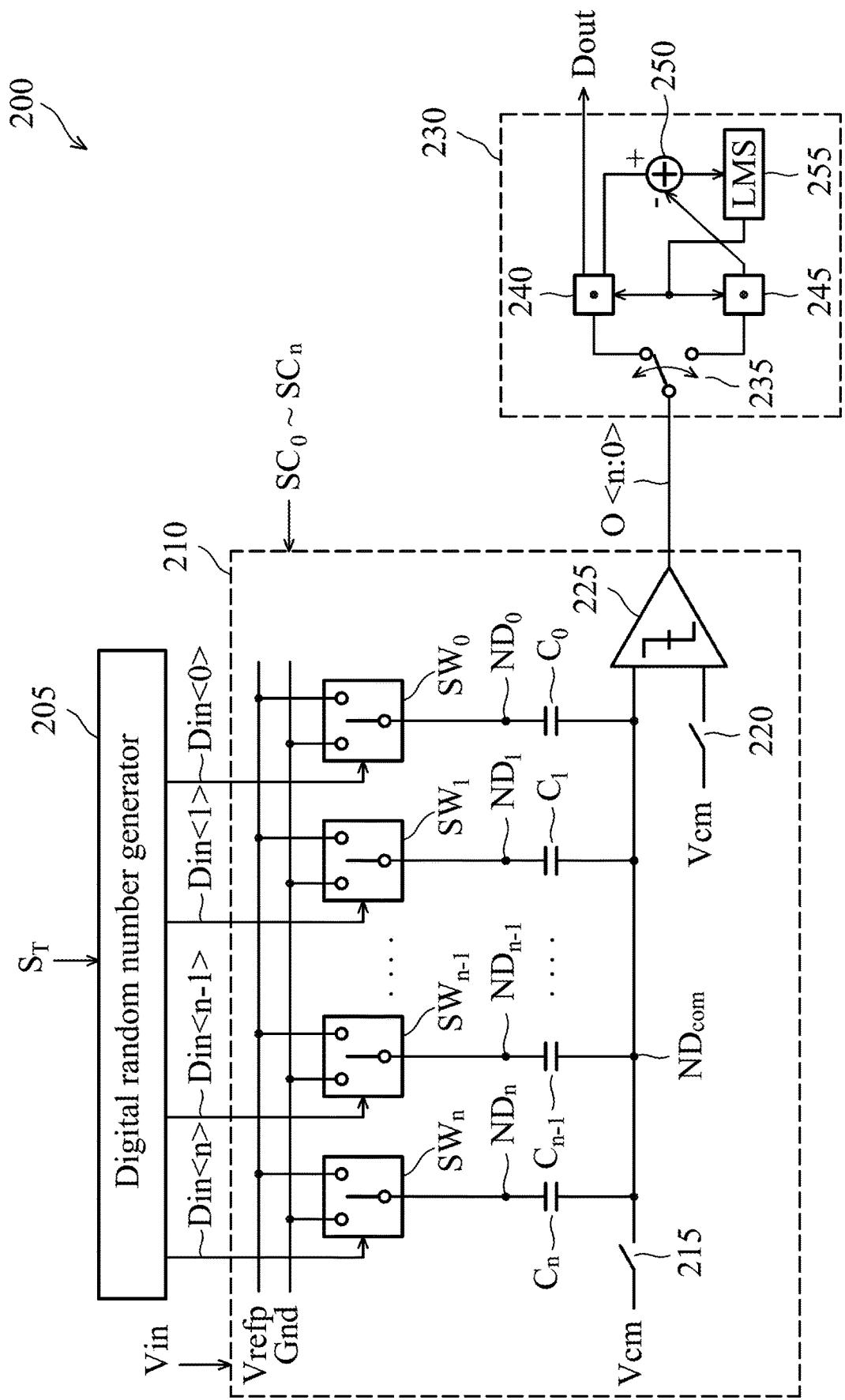
FIG. 2 is a schematic diagram of another exemplary embodiment of the digital background calibration circuit, according to various aspects of the present disclosure.

FIG. 2 is a schematic diagram of another exemplary embodiment of the digital background calibration circuit, according to various aspects of the present disclosure. The digital background calibration circuit 200 comprises a digital random number generator 205, an ADC 210 and a calculation circuit 230. In a calibration mode, the digital background calibration circuit 200 generated a calibration signal by itself to correct the capacitances of the sampling capacitors in the ADC 210. In a normal mode, the digital background calibration circuit 200 transforms an external analog signal to a digital signal. In one embodiment, the digital random number generator 205, the ADC 210 and the calculation circuit 230 are integrated in a single chip.

The digital random number generator 205 is configured to generate a digital sequence Din<n:0>. In one embodiment, the digital random number generator 205 adjusts the values of the digital sequence Din<n:0> according to a trigger signal $S_T$. The trigger signal $S_T$ is generated from the ADC 210 or the calculation circuit 230. In another embodiment, the trigger signal $S_T$ is generated by an external circuit (not shown). The external circuit may be independent of the digital background calibration circuit 200 or integrated within the digital background calibration circuit 200. Since the features of the digital random number generator 205 are the same as the features of the digital random number generator 105 shown in FIG. 1, a description of the features of the digital random number generator 205 is omitted.

ADC 210 is configured to perform a sample and hold operation for an analog signal. During a calibration period, the ADC 210 performs the sample and hold operation for the digital sequence Din<n:0>. During a normal period, the ADC 210 performs the sample and hold operation for an external analog signal Vin, wherein the external analog signal Vin is generated by an external circuit which is independent of the digital background calculation circuit 200.

In this embodiment, the ADC 210 comprises switches $SW_0 \sim SW_n$, sampling capacitors $C_0 \sim C_n$ and a comparison circuit 225. When the digital background calculation circuit 200 operates in a calculation mode, the switches $SW_0 \sim SW_n$ control the sampling capacitors $C_0 \sim C_n$ according to the values of the digital sequence Din<n:0> to perform a sampling operation for the digital sequence Din<n:0>. When the digital background calculation circuit 200 exits the calculation mode and enters a normal mode, the switches $SW_0 \sim SW_n$ control the sampling capacitors $C_0 \sim C_n$ according to the values of an external analog signal Vin to perform a sampling operation for the external analog signal Vin. Since the features of the switches $SW_0 \sim SW_n$ and the sampling capacitors $C_0 \sim C_n$ shown in FIG. 2 are the same as the features of the switches $SW_0 \sim SW_n$ and the sampling capacitors $C_0 \sim C_n$ shown in FIG. 1, the descriptions of the features of the switches $SW_0 \sim SW_n$ and the sampling capacitors $C_0 \sim C_n$ are omitted.

The comparison circuit 225 is coupled to the common node $ND_{com}$ and the switch 220 to read and output the sampling results 0<n:0> of the sampling capacitors $C_0 \sim C_n$. When the switches 215 and 220 are turned on, the ADC 210 enters a sampling mode. At this mode, the control signals $SC_0 \sim SC_n$ are utilized such that the comparison circuit 225 sequentially outputs the sampling results 0<n:0>. In the present disclosure, the circuit structure of the comparison circuit 225 is not limited. Any circuit can serve as the comparison circuit 225, as long as the circuit is capable of reading the voltages stored in the sampling capacitors $C_0 \sim C_n$.

The calculation circuit 230 calculates and transforms the sampling results 0<n:0> to generate a digital output Dout. In this embodiment, the calculation circuit 230 generates the control signals $SD_0 \sim SC_n$ during the calibration period. The switches $SW_0 \sim SW_n$ provide corresponding voltage (Vrefp or Gnd) to the sampling capacitors $C_0 \sim C_n$ according to the control signals $SC_0 \sim SC_n$. The comparison circuit 225 generates the sampling results 0<n:0> according to the voltages stored in the sampling capacitors $C_0 \sim C_n$. The calculation circuit 230 updates the weight values of the sampling capacitors $C_0 \sim C_n$ according to the sampling results 0<n:0> and records the updated weight values. In some embodiments, the calculation circuit 230 determines whether an error coefficient is less than a predetermined value. If the error coefficient is not less than the predetermined value, the calculation circuit 230 generates a trigger signal $S_T$. The digital random number generator 205 generates another digital sequence according to the trigger signal $S_T$. In this case, the ADC 210 performs the sampling operation for the new digital sequence and the calculation circuit 230 processes the sampling results of the ADC 210 according to the updated weight values to updates the weight values of the sampling capacitors $C_0$~$C_n$ again until the error coefficient is less than the predetermined value. In one embodiment, when the error coefficient is less than the predetermined value, the weight values recorded by the calculation circuit 230 are referred to as final weight values.

During a normal period, the ADC 210 samples an external analog signal Vin. The calculation circuit 230 processes the sampling results O<n:0> of the ADC 210 according to the final weight values to generate a digital output Dout. Since digital background calculation circuit 200 utilizes a specific digital sampling operation to sample an internal digital sequence during the calibration period, the digital background calculation circuit 200 does not receive an external analog signal to perform a calibration operation. Therefore, the calibration cost for the digital background calculation circuit 200 is reduced. Furthermore, the specific digital sampling operation increases the accuracy and the reliability of the ADC 210.

In the present disclosure, the circuit of the calculation circuit is not limited. In this embodiment, the calculation circuit 230 performs a least mean square (LMS) algorithm for the sampling results O<n:0> of the ADC 210. In one embodiment, the calculation circuit 230 comprises a switch 235, registers 240 and 245, processing circuits 250 and 255. The switch 235 is configured to provide the sampling results O<n:0> to the register 240 or 245. In one embodiment, the switch 235 is controlled by the processing circuit 255.

The processing circuit 250 is configured to calculate the data stored in the registers 240 and 250. In one embodiment, the processing circuit 250 calculates the difference between the data stored in the registers 240 and 250. The processing circuit 255 performs the LMS algorithm according to the calculation result of the processing circuit 250 to generate an error coefficient and updates the weight values of the sampling capacitors $C_0$~$C_n$. In one embodiment, the updated weight values are stored in the registers 240 and 245, but the disclosure is not limited thereto. In other embodiments, the updated weight values are stored in a memory.

FIGS. 3A-3F show how the calculation circuit updates weight values according to various aspects of the present disclosure. For brevity, FIGS. 3A-3F only show five switches and five sampling capacitors. First, the calculation circuit 230 enters a direction switching mode. In this mode, the calculation circuit 230 sequentially reads the sampling results of the sampling capacitors $C_0$~$C_n$.

Figure 3A:
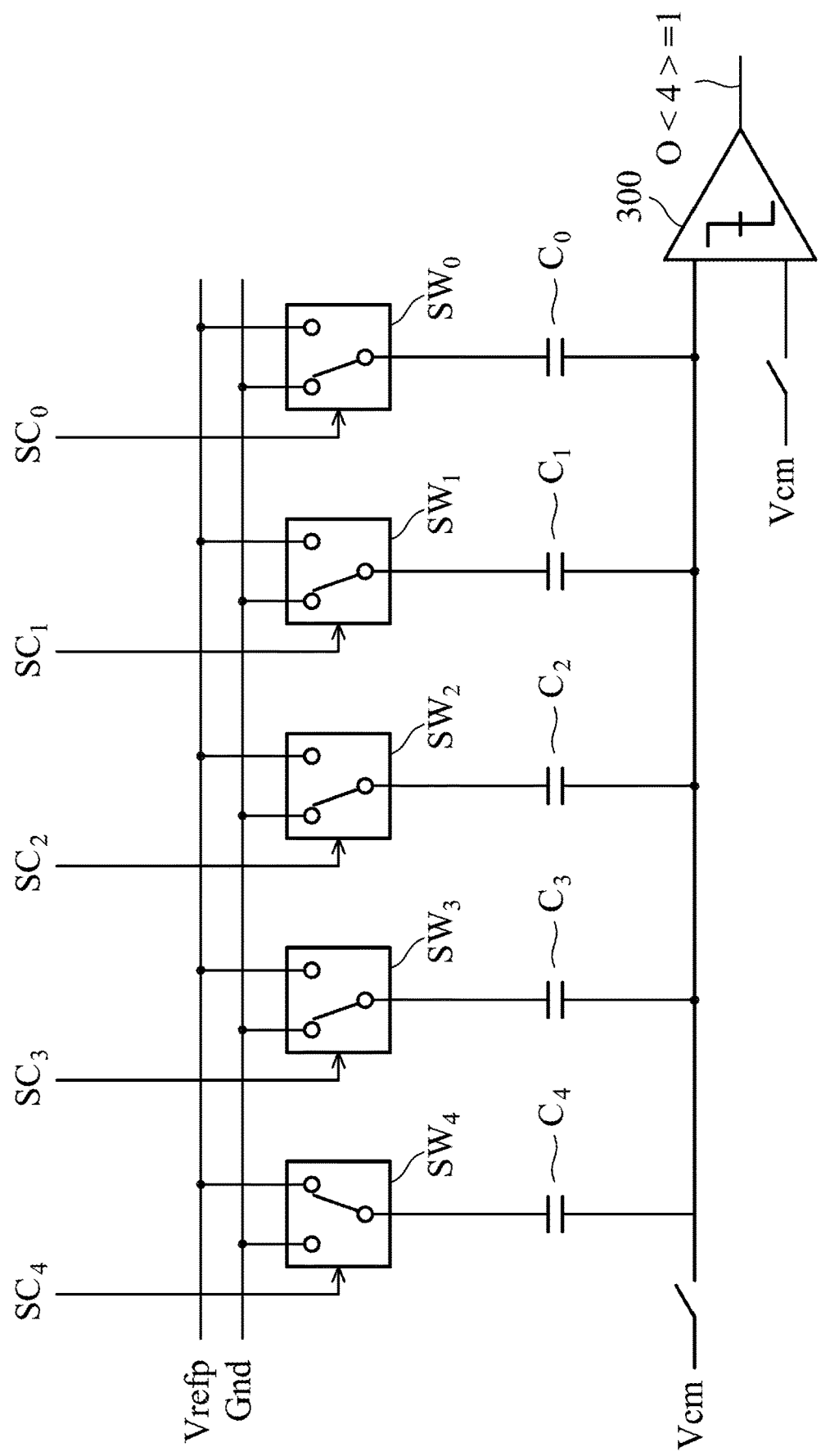
FIGS. 3A-3F show how a calculation circuit updates weight values according to various aspects of the present disclosure.

As shown in FIG. 3A, the calculation circuit 230 provides a high voltage (e.g. Vrefp) to the sampling capacitor $C_4$ and provides a low voltage (e.g. Gnd) to each of the sampling capacitors $C_3$~$C_0$ according to the control signals $SC_0$~$SC_4$. The comparison circuit 300 outputs the sampling result O<4> according to the voltage stored in the sampling capacitor $C_4$. Assume that the value of the sampling result O<4> is "1". In this case, the calculation circuit 230 continuously provides the high voltage to the sampling capacitor $C_4$ via the switch $SW_4$ in the direction switching mode.

Figure 3B:
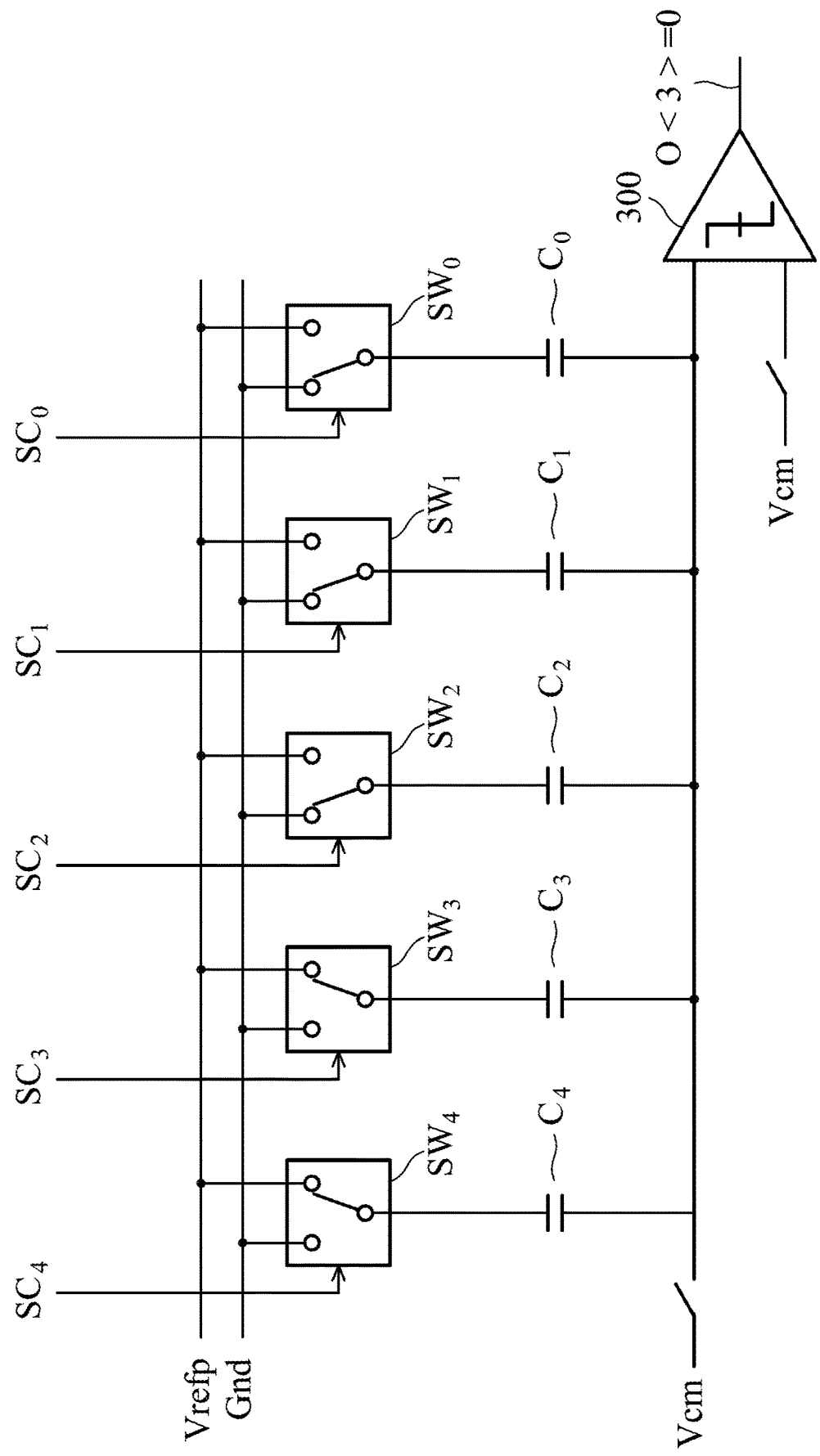

Next, the calculation circuit 230 reads the sampling result of the sampling capacitor $C_3$. In FIG. 3B, the calculation circuit 230 utilizes the control signals $SC_0$~$SC_4$ to provide the high voltage (e.g. Vrefp) to the sampling capacitors $C_4$ and $C_3$ and provide the low voltage (e.g. Gnd) to the sampling capacitors $C_2$~$C_0$. The comparison circuit 300 outputs the sampling result O<3> according to the voltage stored in the sampling capacitor $C_3$. Assume that the value of the sampling result O<3> is "0". In this case, the calculation circuit 230 continuously provides the low voltage to the sampling capacitor $C_3$ via the switch $SW_3$ in the direction switching mode.

Figure 3C:
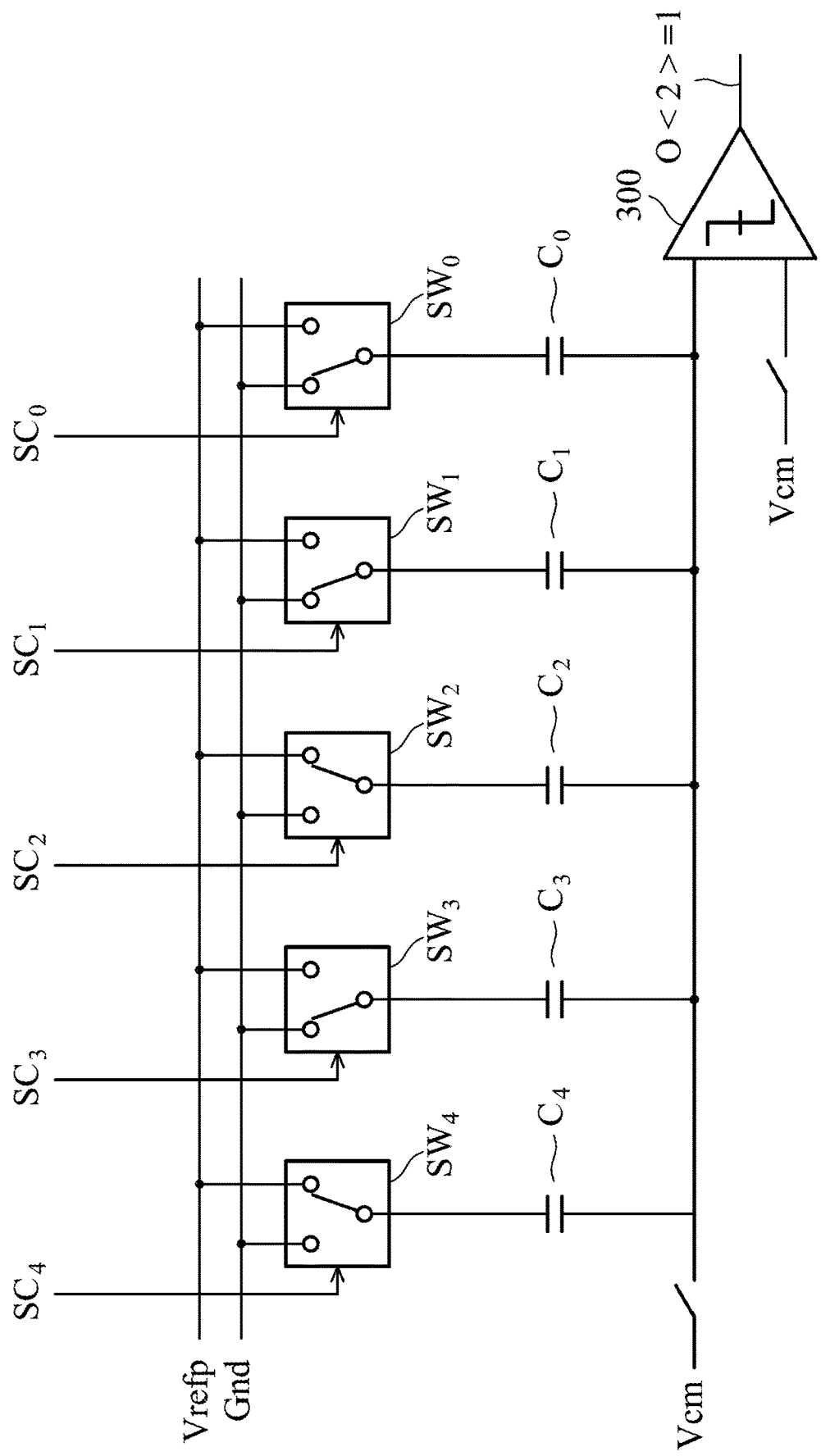

Then, the calculation circuit 230 reads the sampling result of the sampling capacitor $C_2$. In FIG. 3C, the calculation circuit 230 utilizes the control signals $SC_0$~$SC_4$ to provide the high voltage (e.g. Vrefp) to the sampling capacitors $C_4$ and $C_2$ and provide the low voltage (e.g. Gnd) to the sampling capacitors $C_3$, $C_1$ and $C_0$. The comparison circuit 300 outputs the sampling result O<2> according to the voltage stored in the sampling capacitor $C_2$. Assume that the value of the sampling result O<2> is "1". Therefore, in the direction switching mode, the calculation circuit 230 continuously provides the high voltage to the sampling capacitor $C_2$ via the switch $SW_2$.

Next, the calculation circuit 230 sequentially reads the sampling results of the sampling capacitors $C_1$ and $C_0$ and provides the high voltage or the low voltage to the sampling capacitors $C_1$ and $C_0$ according to the sampling results output from the comparison circuit 300. For example, when the sampling result output from the comparison circuit 300 is "1", the calculation circuit 230 provides the high voltage to the corresponding sampling capacitor. However, when the sampling result output from the comparison circuit 300 is "0", the calculation circuit 230 provides the low voltage to the corresponding sampling capacitor. Since the read methods of the sampling capacitors $C_1$ and $C_0$ are the same as the read methods of the sampling capacitors $C_4$~$C_2$, the descriptions of the read methods of the sampling capacitors $C_1$ and $C_0$ are omitted.

Figure 3D:
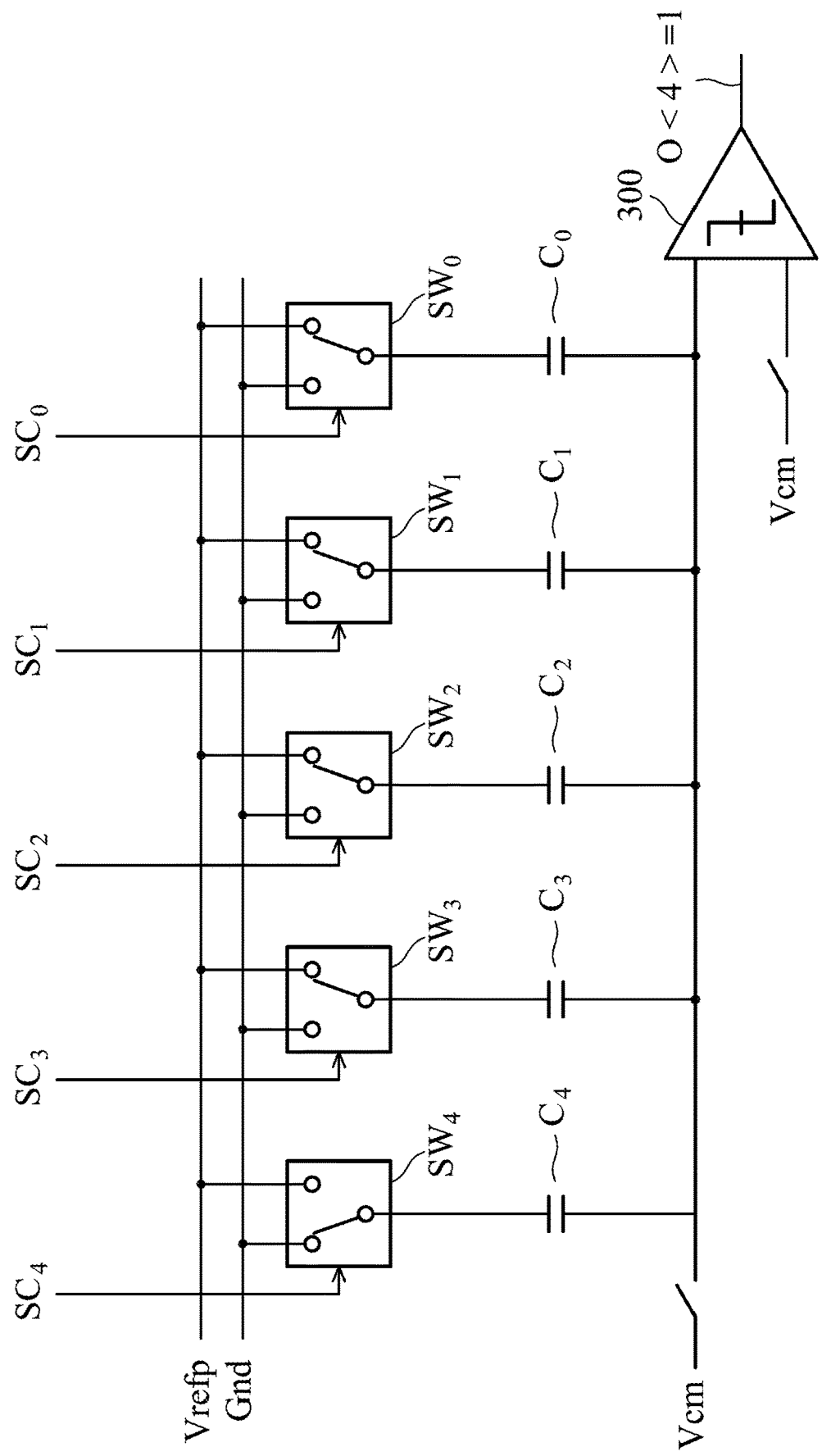

After reading the sampling results of the sampling capacitors $C_1$ and $C_0$, the calculation circuit 230 enters a reverse switching mode. In this mode, the calculation circuit 230 sequentially reads the sampling results of the sampling capacitors $C_4$~$C_0$. As shown in FIG. 3D, the calculation circuit 230 utilizes the control signals $SC_3$~$SC_0$ to provide the high voltage (e.g. Vrefp) to the sampling capacitors $C_3$~$C_0$ and utilizes the control signal $SC_4$ to provide the low voltage (e.g. Gnd) to the sampling capacitor $C_4$. The comparison circuit 300 outputs the sampling result O<4> according to the voltage stored in the sampling capacitor $C_4$. Since the value of the sampling result O<4> is "1", the calculation circuit 230 continuously provides the high voltage to the sampling capacitor $C_4$ via the switch $SW_4$.

Figure 3E:
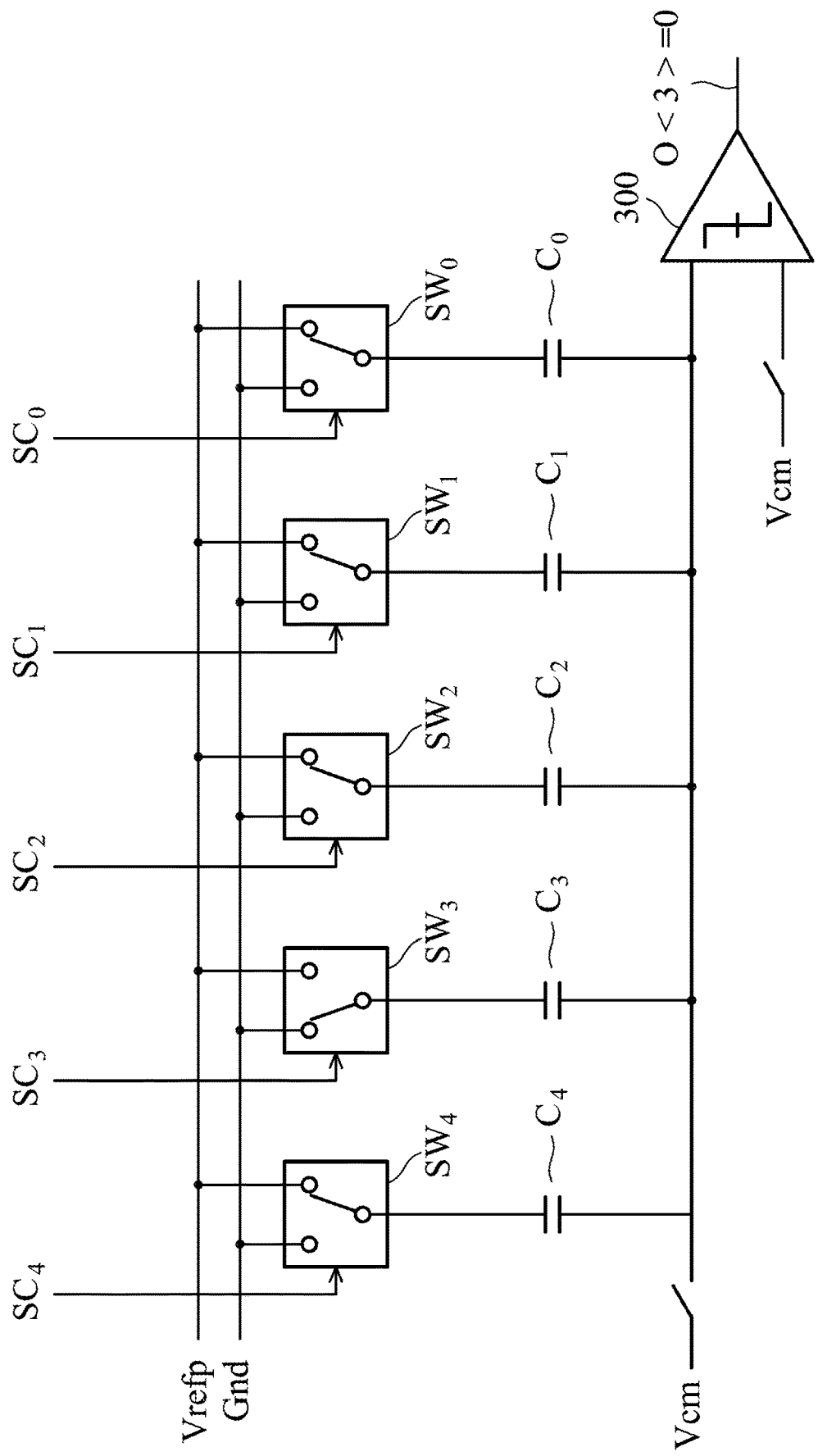

Next, the calculation circuit 230 reads the sampling result of the sampling capacitor $C_3$. In FIG. 3E, the calculation circuit 230 utilizes the control signals $SC_4$~$SC_0$ to provide the high voltage (e.g. Vrefp) to the sampling capacitors $C_4$ and $C_2$~$C_0$ and provide the low voltage (e.g. Gnd) to the sampling capacitor $C_3$. The comparison circuit 300 outputs the sampling result O<3> according to the voltage stored in the sampling capacitor $C_3$. Since the value of the sampling result O<3> is "0", the calculation circuit 230 continuously provides the low voltage to the sampling capacitor $C_3$ via the switch $SW_3$ in the reverse switching mode.

Figure 3F:
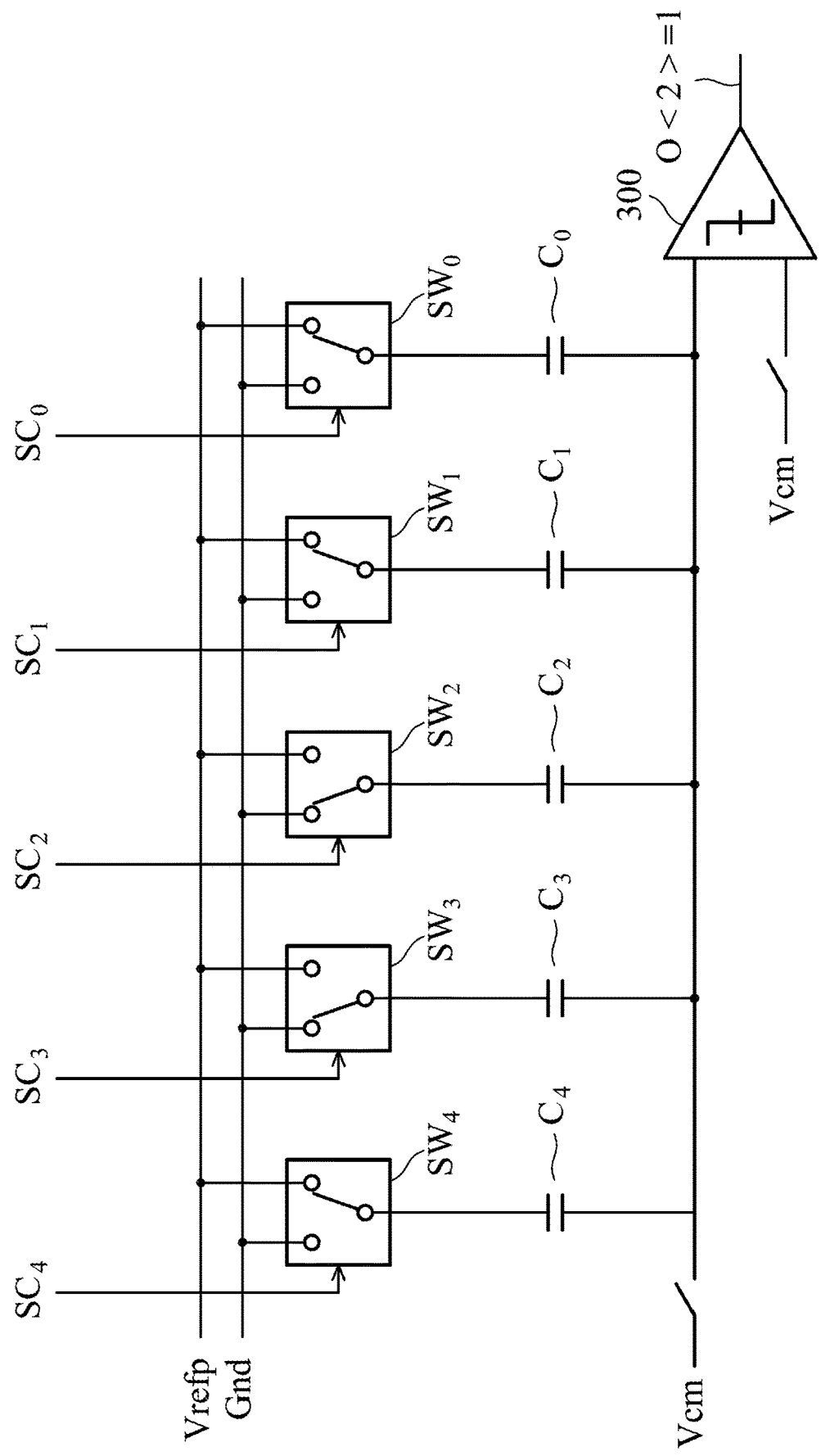

Then, the calculation circuit 230 reads the sampling result of the sampling capacitor $C_2$. In FIG. 3F, the calculation circuit 230 utilizes the control signals $SC_4$~$SC_0$ to provide the high voltage (e.g. Vrefp) to the sampling capacitors $C_4$ and $C_1$ and $C_0$ and provide the low voltage (e.g. Gnd) to the sampling capacitors $C_2$ and $C_3$. The comparison circuit 300 outputs the sampling result O<2> according to the voltage stored in the sampling capacitor $C_2$. Since the value of the sampling result O<2> is "1", the calculation circuit 230 continuously provides the low voltage to the sampling capacitor $C_2$ via the switch $SW_2$ in the reverse switching mode.

Next, the calculation circuit 230 reads the sampling results of the sampling capacitors $C_1$ and $C_0$ and provides the high voltage or the low voltage to the sampling capacitors $C_1$ and $C_0$ according to the sampling results output from the comparison circuit 300. For example, when the sampling result output from the comparison circuit 300 is "1", the calculation circuit 230 provides the high voltage to the corresponding sampling capacitor. However, when the sampling result output from the comparison circuit 300 is "0", the calculation circuit 230 provides the low voltage to the corresponding sampling capacitor. Since the methods for reading the sampling capacitors $C_1$ and $C_0$ are the same as the methods for reading the sampling capacitors $C_4$~$C_2$, the descriptions of the methods for reading the sampling capacitors $C_1$ and $C_0$ are omitted.

The calculation circuit 230 calculates the read results in the direction and the reverse switching modes according to the pre-weight values of the sampling capacitors $C_4$~$C_0$ to generate a calculation result. The calculation circuit 230 updates the weight values of the sampling capacitors $C_4$~$C_0$ according to the calculation result. In another embodiment, the calculation circuit 230 obtains an error coefficient according to the calculation result. In this case, the calculation circuit 230 determines whether the error coefficient is less than a predetermined value. If the error coefficient is not less than the predetermined value, the calculation circuit 230 triggers the digital random number generator 205 to generate a new digital sequence. The ADC 210 samples the new digital sequence to generate a plurality sampling results. The calculation circuit 230 enters the direction switching mode and the reverse switching mode to read the sampling results and updates the weight values until the error coefficient is less than the predetermined value.

Since the digital background calculation circuit 200 has corrected the weight values of the sampling capacitors $C_4$~$C_0$, when the digital background calculation circuit 200 operates in a normal mode, the calculation circuit 230 reads and calculates the sampling results of the ADC according to the updated weight values to generate a correct digital value.

Figure 4:
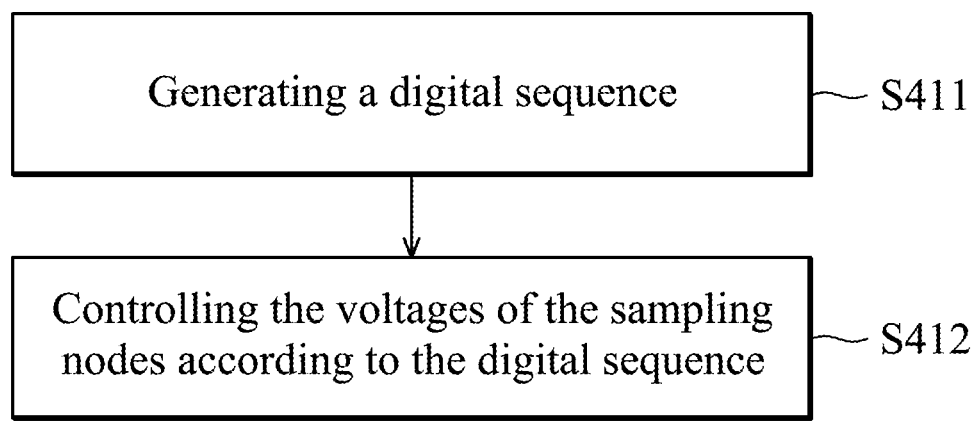
FIG. 4 is a flowchart of an exemplary embodiment of a control method, according to various aspects of the present disclosure.

FIG. 4 is a flowchart of an exemplary embodiment of a control method, according to various aspects of the present disclosure. The control method is capable of applying to a digital background calibration system. The digital background calibration system comprises an ADC. The ADC comprises a plurality of sampling capacitors. Each of the sampling capacitors is coupled to a sampling node.

A digital random number generator is turned on to generate a digital sequence (step S411). The digital sequence comprises a plurality of bits. In one embodiment, the number of the bits of the digital sequence relates to the number of the sampling capacitors. In other embodiments, the digital sequence is a binary sequence. In one embodiment, the digital sequence is a pseudo random sequence or a true random sequence. In some embodiments, the digital random number generator and the ADC are combined in one chip. In one embodiment, the digital random number generator is a linear feedback shift register (LFSR).

During the calibration period, the voltages of the sampling nodes are controlled according to the digital sequence to sample the digital sequence (step S412). Taking FIG. 1 as an example, when the value of the bit Din<n> of the digital sequence Din<n:0> is "1", a reference voltage Vrefp is provided to the sampling node $ND_{com}$. When the value of the bit Din<n> is "0", a ground voltage Gnd is provided to the sampling node $ND_{com}$. The sampling capacitor $C_n$ samples the value of the bit Din<n> according to the voltage of the sampling node $ND_n$.

Figure 5:
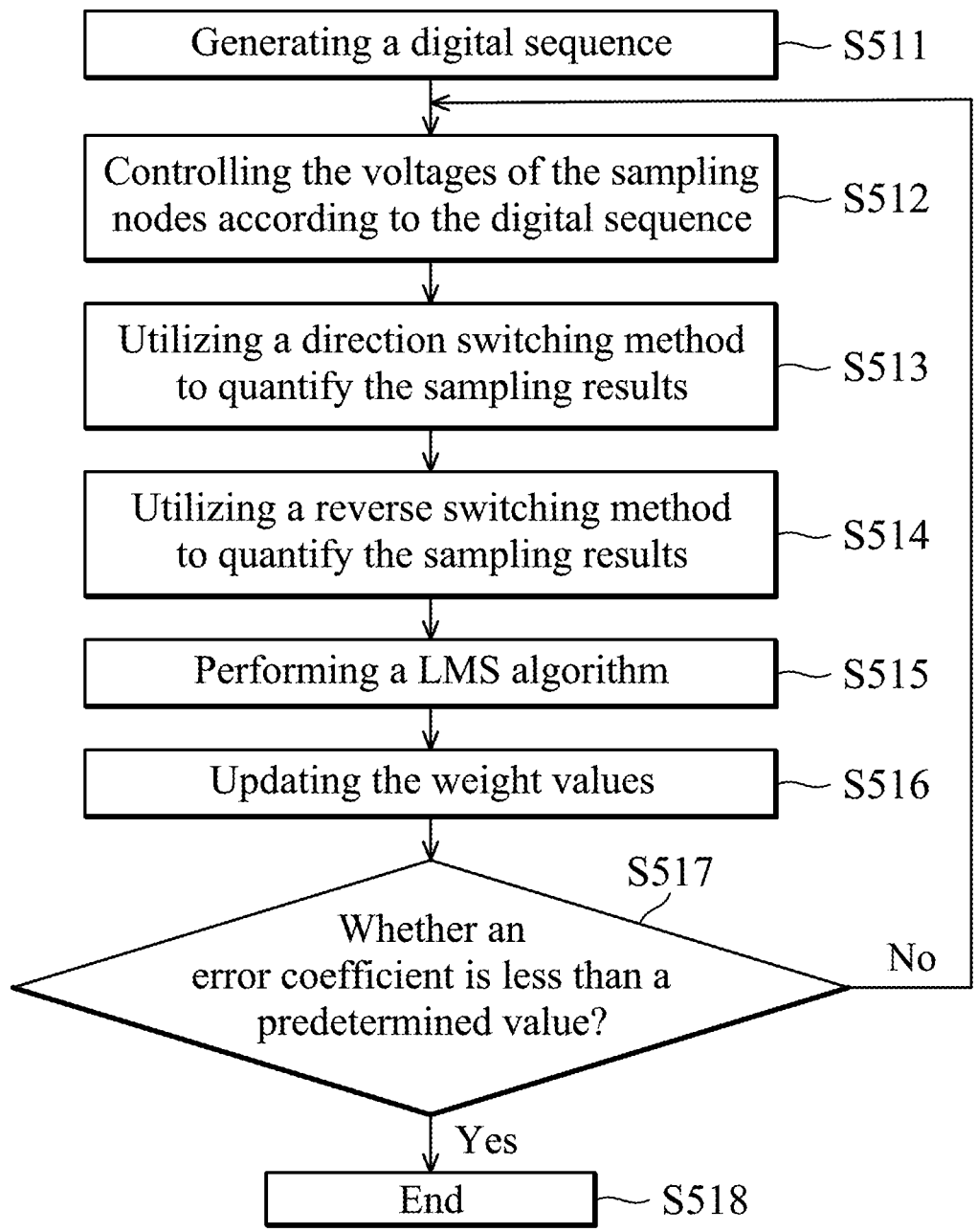
FIG. 5 is a flowchart of another exemplary embodiment of the control method, according to various aspects of the present disclosure.

FIG. 5 is a flowchart of another exemplary embodiment of the control method, according to various aspects of the present disclosure. Since the features of steps S511 and S512 are similar to the features of steps S411 and S412 shown in FIG. 4, the descriptions of the features of steps S511 and S512 are omitted. Step S513 utilizes a direction switching method to control the voltages of the sampling nodes to quantify the sampling results generated by step S512. Taking the sampling capacitor $C_4$ shown in FIG. 3A as an example, step S513 provides a first voltage to the sampling capacitor $C_4$ and reads the voltage stored in the sampling capacitor $C_4$ to generate a first output O<4> during a first period. In one embodiment, when the value of the first output O<4> is "1", the first voltage is continuously provided to the sampling capacitor $C_4$ in step S513 sampling capacitor $C_4$. However, if the value of the first output O<n> is "0", a second voltage is provided to the sampling capacitor $C_4$ in step S513. In this embodiment, the first voltage may be higher than or less than the second voltage.

Step S514 utilizes a reverse switching method to control the voltages of the sampling nodes to quantify the sampling result provided in step S512. Taking the sampling capacitor $C_4$ shown in FIG. 3D as an example, step S514 is to provide a second voltage to the sampling capacitor $C_4$ and read the voltage stored in the sampling capacitor $C_4$ to generate a second output O<4> during a second period. In one embodiment, when the value of the second output O<4> is "0", step S513 provides the second voltage to the sampling capacitor $C_4$ continuously. However, when the value of the second output O<4> is "1", step S513 is performed to provide a first voltage to the sampling capacitor $C_4$.

Step S515 calculates the quantified results of steps S513 and S514. In one embodiment, step S515 processes the quantified results of steps S513 and S514 according to a LMS algorithm to converge a quantization error accurately. Step S516 is performed to update the weight values of the sampling capacitors according to the calculation result of step S515. Next, a determination is made as to whether an error coefficient is less than a predetermined value (step S517). In one embodiment, an error coefficient is generated in step S515. In such cases, step S515 is performed to generate an error coefficient according to the difference between the quantified results of steps S513 and S514.

When the error coefficient is not less than the predetermined value, step S512 is performed to sample a new digital sequence until the error coefficient is less than the predetermined value. When the error coefficient is less than the predetermined value, the calibration operation ends. The present disclosure calibrates the weight values of the sampling capacitors such that the ADC receives and transforms an external analog signal to generate an accurate digital value in a normal mode. Therefore, the reliability of the ADC is increased. In one embodiment, the external analog signal is generated from an external circuit. The external circuit is independent of the digital background calibration system. Furthermore, since the digital background calibration system comprises a digital random number generator to generate a digital sequence to the ADC, no external calibration signal is provided such that the calibration cost and the calibration time are reduced.

Control methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A digital background calibration circuit comprising:
    a digital random number generator configured to generate a first digital sequence having a plurality of bits;
    an analog-to-digital converter (ADC) comprising a plurality of sampling capacitors; and
    a plurality of switches receiving the first digital sequence and coupled to the sampling capacitors, wherein each of the switches corresponds to one of the sampling capacitors,
    wherein during a first period of a calibration period, the digital random number generator controls the sampling capacitors via the switches to sample the first digital sequence to generate a sampled result,
    wherein during a second period of the calibration period, the switches provide voltages to the sampling capacitors according to a direction switching method to quantify the sampling result and generate a first quantified result,
    wherein during a third period of the calibration period, the switches provide voltages to the sampling capacitors according to a reserve switching method to quantify the sampling result and generate a second quantified result,
    wherein a calculation circuit processes the first and second quantified results according to a least mean square (LMS) algorithm to generate an error coefficient,
    wherein in response to the error coefficient not being less than a predetermined value, the digital random number generator is configured to generate a second digital sequence,
    wherein during the second period of the calibration period, a first switch of the switches provides a first voltage to a first capacitor of the sampling capacitors, and each of the remaining of the switches provides a second voltage to the corresponding capacitor of the remaining of the sampling capacitors,
    wherein during the third period of the calibration period, the first switch of the switches provides the second voltage to the first capacitor of the sampling capacitors and each of the remaining of the switches provides the first voltage to the corresponding capacitor of the remaining of the sampling capacitors, and
    wherein the first voltage is higher than the second voltage.

2. The digital background calibration circuit as claimed in claim 1, wherein the digital random number generator is a pseudo random number generator or a true random number generator.

3. The digital background calibration circuit as claimed in claim 1, wherein the digital random number generator is a linear feedback shift register (LFSR).

4. The digital background calibration circuit as claimed in claim 1, wherein the ADC is a successive approximation register ADC.

5. The digital background calibration circuit as claimed in claim 1, wherein during the first period, the first switch provides the first voltage or the second voltage to the first capacitor of the sampling capacitors according to a value of a first bit of the bits to sample the value of the first bit; and
    wherein the switches further comprise a second switch providing the first voltage or the second voltage to a second capacitor of the sampling capacitors according to a value of a second bit of the bits to sample the value of the second bit.

6. The digital background calibration circuit as claimed in claim 5, further comprising:
    a comparison circuit coupled to the sampling capacitors,
    wherein the calculation circuit controls the switches during the calibration period.

7. The digital background calibration circuit as claimed in claim 6, wherein during the second period, the calculation circuit controls the first switch to provide the first voltage to the first capacitor, and
    wherein during the third period, the calculation circuit controls the first switch to provide the second voltage to the first capacitor.

8. The digital background calibration circuit as claimed in claim 7, wherein during the second period, the comparison circuit generates the first quantified result according to a voltage stored in the first capacitor, and
    wherein during the third period, the comparison circuit generates the second quantified result according to the voltage stored in the first capacitor.

9. The digital background calibration circuit as claimed in claim 8, wherein the calculation circuit executes the LMS algorithm for the first and second quantified results according to a weight value of the first capacitor to generate the error coefficient and update the weight value.

10. The digital background calibration circuit as claimed in claim 9, wherein the calculation circuit determines whether the error coefficient is less than the predetermined value, and
    wherein responsive to the error coefficient not being less than the predetermined value, the digital random number generator is configured to generate the second digital sequence to control the sampling capacitors again.

11. A control method applied to a digital background calibration system comprising an ADC which comprises a plurality of sampling capacitors, wherein each sampling capacitor is coupled to a sampling node, comprising:

utilizing a digital random number generator to generate a first digital sequence comprising a plurality of bits;

during a first period of a calibration period, controlling voltages of the sampling nodes according to the first digital sequence to sample the first digital sequence to generate a sampled result;

during a second period of the calibration period, controlling the voltages of the sampling nodes according to a direction switching method to quantify the sampling result and generate a first quantified result;

during a third period of the calibration period, controlling the voltages of the sampling nodes according to a reserve switching method to quantify the sampling result and generate a second quantified result; and the first and second quantified results according to a least mean square (LMS) algorithm to generate an error coefficient, wherein in response to the error coefficient not being less than a predetermined value, the digital random number generator is utilized to generate a second digital sequence, wherein during the second period of the calibration period, a first voltage is provided to a first sampling node of the sampling nodes and a second voltage is provided to the remaining of the sampling nodes, wherein during the third period of the calibration period, the second voltage is provided to the first sampling node and the first voltage is provided to the remaining of the sampling nodes, wherein the first sampling node is coupled to a specific capacitor among the sampling capacitors, and the first voltage is higher than the second voltage, and wherein the digital random number generator and the ADC are integrated within a chip.

12. The control method as claimed in claim 11, wherein the digital random number generator is a pseudo random number generator or a true random number generator.

13. The control method as claimed in claim 11, wherein the digital random number generator is a linear feedback shift register (LFSR).

14. The control method as claimed in claim 11, further comprising:

during the period, reading a voltage stored in the specific capacitor among the sampling capacitors to generate the first quantified result; and during the third period, reading the voltage stored in the specific capacitor to generate the second quantified result.

15. The control method as claimed in claim 14, wherein during the calibration period, the LMS algorithm is performed for the first and second quantified results according to a weight value of the specific capacitor to generate the error coefficient and update the weight value.

16. The control method as claimed in claim 15, further comprising:

determining whether the error coefficient is less than the predetermined value; and controlling voltages of the sampling nodes according to the second digital sequence to sample the second digital sequence.

* * * * *